United States Patent [19]
Lee et al.

[11] Patent Number: 5,407,859
[45] Date of Patent: Apr. 18, 1995

[54] FIELD EFFECT TRANSISTOR WITH LANDING PAD

[75] Inventors: Kuo-Hua Lee; Chun-Ting Liu, both of Wescosville, Pa.; Ruichen Liu, Warren, N.J.

[73] Assignee: AT&T Corp., Murray Hill, N.J.

[21] Appl. No.: 159,897

[22] Filed: Dec. 1, 1993

[51] Int. Cl.⁶ ............................................. H01L 21/44
[52] U.S. Cl. ...................................... 437/180; 437/41; 437/200
[58] Field of Search .................... 437/41, 40, 200, 180

[56] References Cited

U.S. PATENT DOCUMENTS

| | | | |
|---|---|---|---|
| 4,683,645 | 8/1987 | Naguib et al. | 437/41 |
| 4,844,776 | 12/1987 | Lee et al. | 156/653 |
| 4,922,311 | 4/1989 | Lee et al. | 357/23.1 |
| 5,206,187 | 4/1993 | Doan et al. | 437/192 |
| 5,234,851 | 8/1993 | Korman et al. | 437/44 |
| 5,254,490 | 10/1993 | Kondo | 437/44 |
| 5,340,761 | 8/1994 | Loh et al. | 437/44 |

Primary Examiner—George Fourson
Assistant Examiner—David Mason
Attorney, Agent, or Firm—Richard D. Laumann

[57] ABSTRACT

A field effect transistor is fabricated with a window pad layer that is patterned using a patterned dielectric with sublithographic spacing as an etch mask. Desirable attributes of the transistor include small junction capacitance.

12 Claims, 1 Drawing Sheet

5,407,859

FIELD EFFECT TRANSISTOR WITH LANDING PAD

TECHNICAL FIELD

This invention relates generally to the field of field effect transistors and particularly to the field of such transistors that have landing pads.

BACKGROUND OF THE INVENTION

As integrated circuits have become more complex, the individual devices, such as field effect transistors, forming the integrated circuits have become smaller and more closely spaced to each other. Simple shrinkage of device dimensions was not alone sufficient to permit the increased complexity of the circuits; new processing technologies and innovative devices were also required.

An example will illustrate this point. The source and drain regions of a field effect transistor must be separately electrically contacted. This is frequently done by depositing a dielectric layer over the transistor, patterning the dielectric layer to form windows which expose portions of the source/drain regions, and then depositing a metal in the window. However, to minimize the substrate area used by the device, the source and drain regions should be small. Short channel lengths, determined by the gate width, impose a minimum separation on the windows. That is, the windows must be relatively small and close to each other, but misalignment of the windows with respect to the source/drain regions must not result in a window exposing portions of both a source and a drain region.

An innovative design which decreases the alignment accuracy required for the windows is described in U.S. Pat. Nos. 4,844,776 and 4,922,311 issued to K.-H. Lee, C.-Y. Lu and D. Yaney. These patents describe both a device and a method for making the device which is termed a folded extended window field effect transistor and is commonly referred to by the acronym FEWMOS. In an exemplary embodiment, a layer of a conducting material, such as TiN, is blanket deposited after transistor elements, including an insulating layer on top of the gate electrode, are formed. Of course, $WSi_2$ could also be used. The conducting material is patterned to form window pads which cover at least portions of the source/drain regions. The window pads may be larger than the source/drain regions provided that they do not contact each other on top of the gate electrode; they may also extend onto the field oxide regions adjacent the source/drain regions. Improved tolerance for window misalignment is obtained because the windows must expose portions of the window pads which are larger than the source/drain regions. Additionally, the window pads may act as etch stop layers thereby preventing etching into the source/drain regions when the windows in the dielectric are etched.

An important transistor design parameter for transistor fabrication is the source/drain region surface area because the junction capacitance is proportional to this area. The junction capacitance is an important parameter in determining device operating frequency. A transistor which uses window pads and thereby has the desirable attributes of FEWMOS and also minimizes source/drain area and thus, junction capacitance, is desirable.

SUMMARY OF THE INVENTION

According to an exemplary embodiment of this invention, a field effect transistor having a landing pad is fabricated by forming the source/drain regions and the gate electrode of the field effect transistors, and depositing a conducting landing pad layer and a dielectric layer. A layer of resist is then formed and patterned to expose selected portions of the dielectric layer which are then removed. The patterned dielectric layer is used as an etch mask to pattern the window pad layer. Device fabrication is then completed. In a preferred embodiment, dielectric spacers are formed on the patterned dielectric layer prior to etching. The patterned dielectric layer with spacers acts as an oxide hard mask for the etching. The dielectric layer need not be removed prior to subsequent processing.

For reasons of clarity, the elements depicted are not shown to scale.

DETAILED DESCRIPTION

Figure 1:
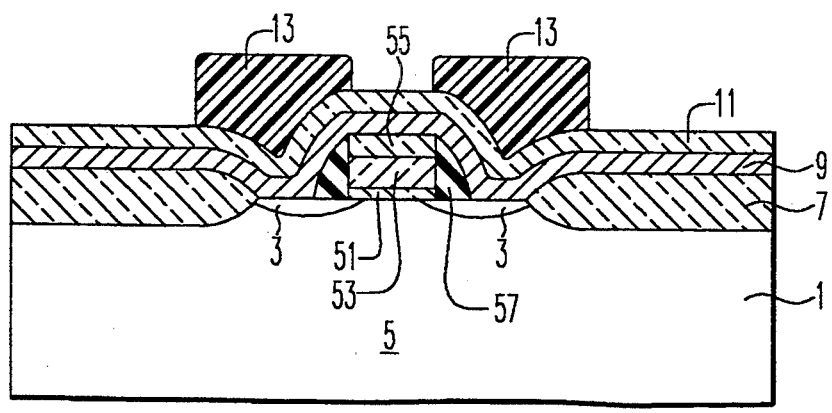
FIGS. 1-4 are sectional views of a portion of a field effect transistor at various stages of fabrication according to this invention.

The invention will be described by reference to an exemplary embodiment. FIG. 1 is a sectional view of a field effect transistor showing substrate 1, source/drain regions 3, gate electrode 5, field oxide regions 7, landing pad layer 9, dielectric layer 11, and patterned photoresist layer 13. The patterned photoresist 13 exposes portions of the dielectric layer 11 that cover the portions of window pad layer 9 that will be subsequently removed. The gate electrode 5 has gate oxide 51, conducting layer 53, insulating top layer 55, and dielectric sidewalls 57.

The structure depicted will be readily formed by those skilled in the art using well known materials and well known techniques. The field effect transistor will be readily fabricated by those skilled in the art. The substrate 1 is typically silicon and the conducting layer 53 in the gate electrode is typically polysilicon. The gate electrode may be formed by conventional deposition and patterning techniques. The dielectric layer 11, the insulating top layer 55, and the insulating sidewalls are typically silicon oxides. The source/drain regions are formed by ion implantation of any of the well known dopants with due consideration being given, of course, to whether an n- or a p-channel transistor is being fabricated. The landing pad layer is formed by a conducting material such as a conducting nitride or silicide. Titanium nitride, TiN, and tungsten silicide, $WSi_2$ are exemplary choices.

Other materials may be used; consideration must be given to proper characteristics such as etching characteristics. The resist is typically a commercially available resist with due consideration being given, of course, to the sensitivity of the resist to the radiation being used for lithographic patterning. Conventional lithographic patterning techniques may be used. The structure depicted will thus be formed using well-known and conventional processing steps.

Figure 2:
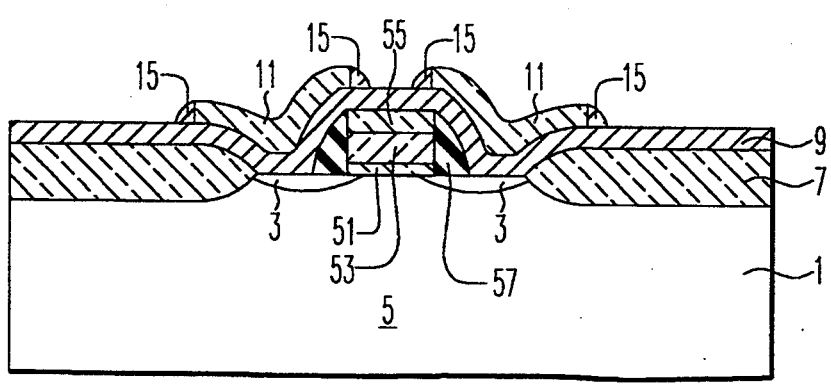
Figure 3:
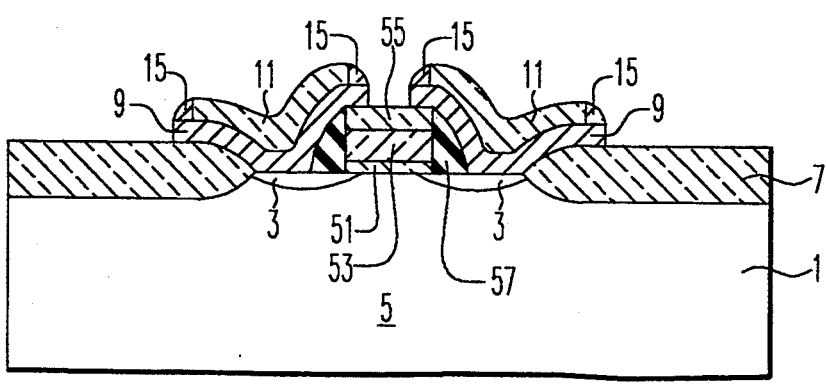

The patterned resist 13 is now used as an etch mask and the exposed portions of the dielectric layer 11 are removed thereby exposing portions of the landing pad layer 9. The resist is now stripped using conventional techniques. If a sublithographic spacing between the portions of the landing pad layer that extend over the gate electrode is desired, a dielectric layer may be deposited and etched back to leave the dielectric spacers 15 as shown in FIG. 2. A convenient dielectric material to use is an oxide. Of course, other methods may be used to form the dielectric spacers. The patterned dielectric 11 with spacers 15 is used as an etch mask for the etching and removal of the exposed portions of the landing pad layer 9. Dry etches having the desired selectivity between the dielectric and landing pad layers will be readily selected by those skilled in the art. The resulting structure is depicted in FIG. 3.

The remaining dielectric layer may be removed if so desired; however, another dielectric layer 17 is typically deposited and patterned and there is, therefore, no compelling reason to remove dielectric layer 11 at this point in the fabrication sequence.

Figure 4:
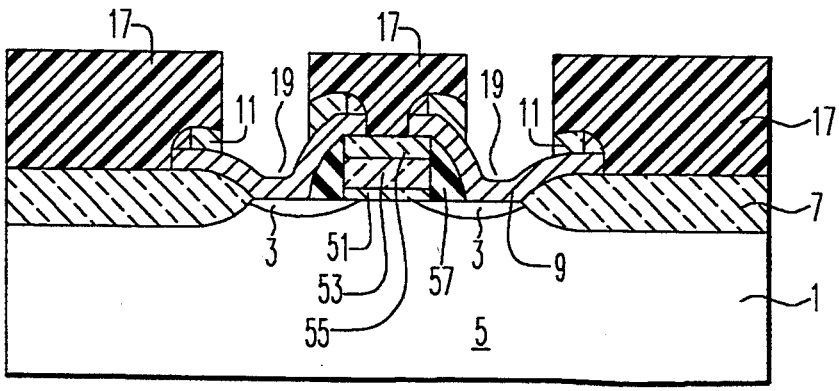

The dielectric layer 17 mentioned in the previous paragraph is now deposited and a layer of resist formed on the dielectric layer 17. The resist is then patterned to form openings and the openings are used to pattern dielectric 17 to form windows which expose selected portions of the dielectric layer 11. The exposed portions of the dielectric layer 11 are over portions of the window pad layers 9 that will be exposed when the dielectric layer 11 is etched during the patterning of windows 19 through dielectric 17. The resulting structure is depicted in FIG. 4. Device fabrication is now completed using conventional processing. For example, metal is deposited in the dielectric windows exposing portions of the window pad layer.

The fabrication process described can result in relatively small transistors as will be evident from the following discussion. Let the distance between the sidewall spacer on the gate electrode and the field oxide be h. This distance can now be reduced to one nesting tolerance plus the desired minimum contacting width. The channel width is in the direction perpendicular to the figures and is large compared to the distance between the gate electrode and the field oxide. The minimum contacting width can be, for purposes of illustration, 0.1 $\mu$m. If one nesting tolerance is 0.15 $\mu$m, the distance, h, will be only 0.25 $\mu$m. By contrast, conventional designs could have the distance, h, as large as 1.0 $\mu$m for a 0.5 $\mu$m contact window and spacings of 0.25 $\mu$m between the contact window and the field oxide and the contact window and the gate spacer for purposes of low junction leakage and transistor performance, respectively.

Variations in the embodiment described will be readily thought of by those skilled in the art. If the lithographically defined spacing between portions of the landing pad layer is sufficient, spacer formation may be omitted.

We claim:

1. A method of making a field effect transistor comprising the steps of:
   forming the source/drain regions and the gate electrode of said field effect transistor between field oxide regions;
   depositing a conducting landing pad layer, said layer comprises a conducting nitride;
   depositing a dielectric layer;
   depositing a layer resist;
   patterning said resist to expose selected portions of said dielectric layer over said gate electrode and said field oxide regions;
   removing said exposed portions of said dielectric layer to expose portions of said conducting landing pad layer; and
   using said dielectric layer to pattern said conducting landing pad layer.

2. A method as recited in claim 1 further comprising the step of:
   forming dielectric spacers on said patterned dielectric layer prior to pattering said conducting landing pad layer.

3. A method as recited in claim 2 in which said forming step comprises the steps of depositing a dielectric layer and etching back to form said spacers.

4. A method as recited in claim 1 comprising the further steps of depositing a dielectric layer over said patterned conducting landing pad layer, and
   patterning said second dielectric layer to form windows which expose portions of said patterned dielectric layer; and
   exposing portions of said conducting landing pad layer using said dielectric layer as an etch mask.

5. A method as recited in claim 4 comprising the further step of depositing metal in said windows.

6. A method as recited in claim 6 in which said conducting nitride consists essentially of titanium nitride.

7. A method of making a field effect transistor comprising the steps of:
   forming the source/drain regions and the gate electrode of said field effect transistor between field oxide regions;
   depositing a conducting landing pad layer;
   depositing a dielectric layer;
   depositing a layer of resist;
   patterning said resist to expose selected portions of said dielectric layer over said gate electrode and said field oxide regions;
   removing said exposed portions of said dielectric layer to expose portions of said conducting landing pad layer;
   forming dielectric spacers on said patterned dielectric layer prior to patterning said conducting landing pad layer; and using said dielectric layer to pattern said conducting landing pad layer.

8. A method as recited in claim 7 in which said forming steps comprises the steps of depositing a dielectric layer and etching back to form said spacers.

9. A method as recited in claim 7 comprising the further steps of depositing a dielectric layer over said patterned conducting landing pad layer, and
   patterning said dielectric layer to form windows which expose portions of said patterned dielectric layer; and
   exposing portions of said conducting landing pad layer using said dielectric layer as an etch mask.

10. A method as recited in claim 9 comprising the further step of depositing metal in said windows.

11. A method as recited in claim 7 in which said conductive landing window pad layer comprises a conducting nitride.

12. A method as recited in claim 11 in which said conducting nitride consists essentially of titanium nitride.

* * * * *